United States Patent
Chen et al.

(10) Patent No.: US 7,361,566 B2
(45) Date of Patent: **\*Apr. 22, 2008**

(54) METHOD OF FORMING POLY-SILICON THIN FILM TRANSISTORS

(75) Inventors: Chi-Lin Chen, Hsinchu (TW); Shun-Fa Huang, Chang Hua (TW); Liang-Tang Wang, Tainan (TW)

(73) Assignee: Industrial Technology Research Institute, Chutung Town, Hsinchu Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/479,895

(22) Filed: Jun. 30, 2006

(65) Prior Publication Data

US 2006/0258064 A1    Nov. 16, 2006

Related U.S. Application Data

(62) Division of application No. 10/733,721, filed on Dec. 11, 2003, now Pat. No. 7,094,656.

(30) Foreign Application Priority Data

Oct. 7, 2003    (TW) .............................. 92127868 A

(51) Int. Cl.
*H01L 21/336* (2006.01)

(52) U.S. Cl. .................................................... 438/308

(58) Field of Classification Search ................. 438/308
See application file for complete search history.

(56) References Cited

U.S. PATENT DOCUMENTS

| 5,773,329 | A | | 6/1998 | Kuo |
| 5,817,548 | A | | 10/1998 | Noguchi et al. |
| 5,872,889 | A | | 2/1999 | Kaltenbrunner |
| 5,943,593 | A | * | 8/1999 | Noguchi et al. ............ 438/487 |
| 7,094,656 | B2 | * | 8/2006 | Chen et al. ................. 438/308 |
| 2004/0147139 | A1 | | 7/2004 | Jiang |
| 2004/0253797 | A1 | | 12/2004 | Huang et al. |

FOREIGN PATENT DOCUMENTS

| EP | 0 840 359 | 5/1998 |
| JP | 63-47980 | 2/1998 |
| JP | 2000/68513 | 3/2000 |

\* cited by examiner

*Primary Examiner*—Evan Pert
(74) *Attorney, Agent, or Firm*—Thomas, Kayden, Horstemeyer & Risley

(57) ABSTRACT

A method of forming poly-silicon thin film transistors is described. An amorphous silicon thin film transistor is formed on a substrate, and then the Infrared (IR) heating process is used. A gate metal and source/drain metal are heated rapidly, and conduct heat energy to an amorphous silicon layer. Next, crystallization occurs in the amorphous silicon layer to form poly-silicon. Therefore a poly-silicon thin film transistor is produced.

7 Claims, 4 Drawing Sheets

METHOD OF FORMING POLY-SILICON THIN FILM TRANSISTORS

The present application is a divisional application of U.S. patent application Ser. No. 10/733,721, filed Dec. 11, 2003 now U.S. Pat. No. 7,094,656.

FIELD OF THE INVENTION

The present invention relates to a method of forming a poly-silicon thin film transistor, and more particularly, to a method of changing an amorphous silicon thin film transistor directly into a poly-silicon thin film transistor.

BACKGROUND OF THE INVENTION

Thin film transistors (TFT) have generally been used as devices for active matrix liquid crystal displays (AMLCD). The thin film transistors usually have two types of amorphous silicon (a-Si) and poly-silicon (poly-Si) for different silicon films. The mobility of an a-Si TFT is only about 0.5-1 $cm^2$/V-s, but a poly-Si TFT has much higher mobility for better crystal character and fewer crystal defects in poly-Si. Therefore, displays fabricated from poly-Si TFT have advantages of high response speed, high resolution, and integrated driver circuits.

There are some drawbacks such as lower product yield, complex processes, and high process cost existing in the poly-Si TFT fabrication. In contrast, a-Si TFTs are mainly fabricated for displays with a lower process cost and well-developed techniques.

Owing to the bottleneck of crystallization techniques, the poly-Si TFT is still not the market mainstream; the conventional methods for fabricating poly-Si films are solid phase crystallization (SPC), excimer laser annealing (ELA), and metal induced lateral crystallization (MILC). SPC is not applicable to flat panel display fabrication because the upper limit temperature of a glass substrate is 650° C., while ELA has drawbacks of the high cost for laser light, process stability, and poor crystal uniformity. Besides, MILC may have problems in metal diffusion. Therefore, present poly-Si forming methods have technical problems and higher production cost for more complex processes. So the poly-Si TFT is still unable to compete with the a-Si TFT.

Further, because the technical problems in poly-Si films fabrication have not been overcome, some manufacturing difficulties exist if the poly-Si TFT fabrication present is utilized to develop large-size displays.

SUMMARY OF THE INVENTION

An objective of the present invention is to provide a method of forming poly-Si TFT for improving the flat panel display performance. The poly-Si TFT with high mobility can be produced and the superiority in a-Si TFT fabrication also can be kept at the same time. Each film material has different absorption of infrared rays (IR); a metal film with good absorption of IR and thermal stability is used as a hot plate, and the metal film serving as the hot plate absorbs heat energy from the IR by IR heating after producing an a-Si TFT. Then, the metal film transfers the heat energy to the a-Si layer, and the a-Si layer crystallizes to become a poly-Si layer, thus forming a poly-Si TFT.

According to one preferred embodiment of this invention, a bottom-gate a-Si TFT with back channel etch (BCE) structural type is produced on a substrate, and then IR heating is performed. A gate metal and a source/drain (S/D) metal in the a-Si TFT absorb heat energy from the IR rapidly and transfer the heat energy to the a-Si layer; the a-Si layer is therefore induced to crystallize and become a poly-Si layer. Thus, a BCE-type a-Si TFT is transformed into a BCE-type poly-Si TFT.

According to another preferred embodiment of this invention, a bottom-gate a-Si TFT with channel protect (CHP) structural type is produced on a substrate, and then IR heating is performed. A gate metal and a S/D metal in the a-Si TFT absorb heat energy from the IR rapidly and transfer the heat energy to the a-Si layer; the a-Si layer is therefore induced to crystallize and become a poly-Si layer. Thus, a CHP-type a-Si TFT is transformed into a CHP-type poly-Si TFT.

According to still another preferred embodiment of this invention, a top-gate a-Si TFT is produced on a substrate, and then IR heating is performed. In the same way, a gate metal and a S/D metal in the a-Si TFT absorb heat energy from the IR rapidly and transfer the heat energy to the a-Si layer; the a-Si layer is therefore induced to crystallize and become a poly-Si layer. Thus, a top-gate a-Si TFT is transformed into a top-gate poly-Si TFT.

With the application of the present invention, in addition to preserving the superiority of a-Si TFT fabrication, the poly-Si TFT with good electrical performance is also formed. Thus, the driver circuits can be integrated on a panel to reduce the cost of adding driver circuits to the a-Si TFT.

Further, the poly-Si TFT devices formed by the present invention are useful for improving the liquid crystal display (LCD) performance and even employed to drive the organic light-emitting display (OLED).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention utilizes the different IR absorption of various film materials; the IR heating process is performed on an a-Si TFT product, and the film material with higher IR absorption and good thermal stability absorbs heat energy from the IR and transfers the heat energy to the a-Si layer. The a-Si layer consequently crystallizes to become a poly-Si layer. Hot plate crystallization (HPC) technique is utilized, the film material with higher IR absorption and good thermal stability in the TFT is used as a hot plate, and then the hot plate transfers heat to the a-Si layer to induce crystallization in the a-Si layer. The a-Si layer is thus changed into the poly-Si layer. Therefore, the IR heating process is merely added after the a-Si TFT fabrication processes without changing the general processes and process conditions in the a-Si TFT fabrication, and then the poly-Si TFT is directly obtained from the a-Si TFT.

The metal film is the film material with higher IR absorption and good thermal stability apparently in the TFT devices, and therefore a gate metal and a source/drain (S/D) metal all can be used as the hot plates for absorbing heat energy from the IR. Then, the a-Si layer is crystallized by obtaining the heat energy transferred from the metal films; the a-Si layer is thus effectively changed into the poly-Si layer, and the poly-Si TFT is formed.

The poly-Si TFT is formed by combining the present a-Si TFT fabrication processes with the present invention. According to differences in the TFT structure, there are two kinds of bottom-gate and top-gate structures. The bottom-gate structure further comprises two types of BCE and CHP structure generally used in the a-Si TFT fabrication. The method of forming the poly-Si TFT in accordance with the present invention is combined with the foregoing TFT structures respectively to produce the poly-Si TFT.

Embodiment 1

Figure 1A:
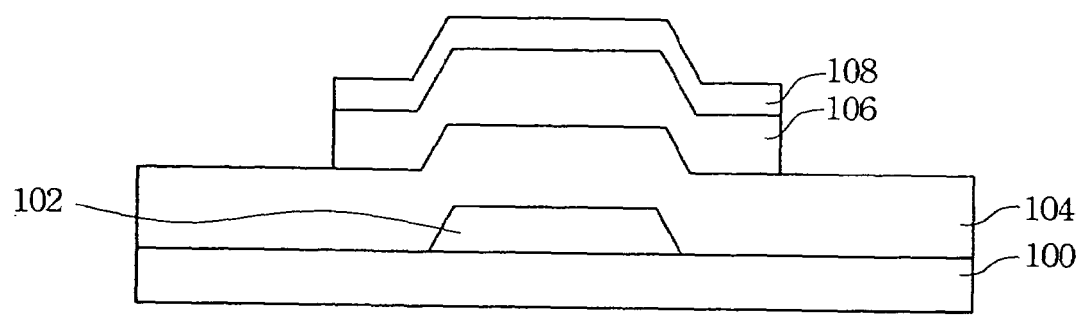
FIGS. 1A-1C are cross-sectional schematic diagrams showing the process for forming a poly-Si TFT in accordance with the first preferred embodiment of the present invention.

The present invention discloses a method of forming the poly-Si TFT combined with the bottom-gate BCE structural type. Referring to FIG. 1A, a gate metal 102 is first formed on a substrate 100 by, for example, physical vapor deposition (PVD), and is then patterned by, for example, photolithography and etching. The substrate 100 may be a glass substrate, and the gate metal 102 is a material with good electric conductivity such as chromium (Cr), molybdenum (Mo) or moly-tungsten (MoW), and the gate metal 102 is also a material with good IR absorption and thermal stability.

A gate insulator 104, an amorphous silicon (a-Si) layer 106, and a doped a-Si layer 108 are formed in turn on the gate metal 102 and the substrate 100 simultaneously by, for example, plasma enhanced chemical vapor deposition (PECVD), and the preferred material of the gate insulator 104 is silicon nitride ($SiN_x$) or silicon oxide ($SiO_x$). Then, the a-Si layer 106 and the doped a-Si layer 108 are patterned partially by, for example, photolithography and etching to form an active layer region (not shown).

Figure 1B:
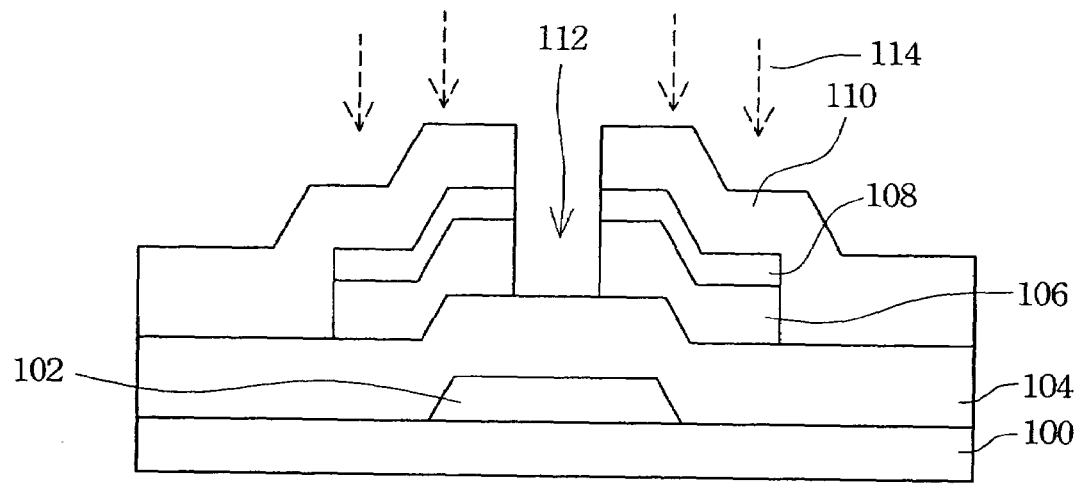

Next, referring to FIG. 1B, a S/D metal 110 is formed by, for example, PVD, and is patterned by, for example, photolithography and etching to form a data-line. The S/D metal 110 is a material with good electric conductivity such as Cr, Mo or MoW, and the S/D metal 110 is also a material with good IR absorption and thermal stability. Then, with the S/D metal 110 serving as a hard mask, the doped a-Si layer 108 between the S/D metal 110 is etched to form an opening 112 exposing a portion of the a-Si layer 106; the a-Si layer 106 in the opening 112 represents a channel region.

Figure 1C:
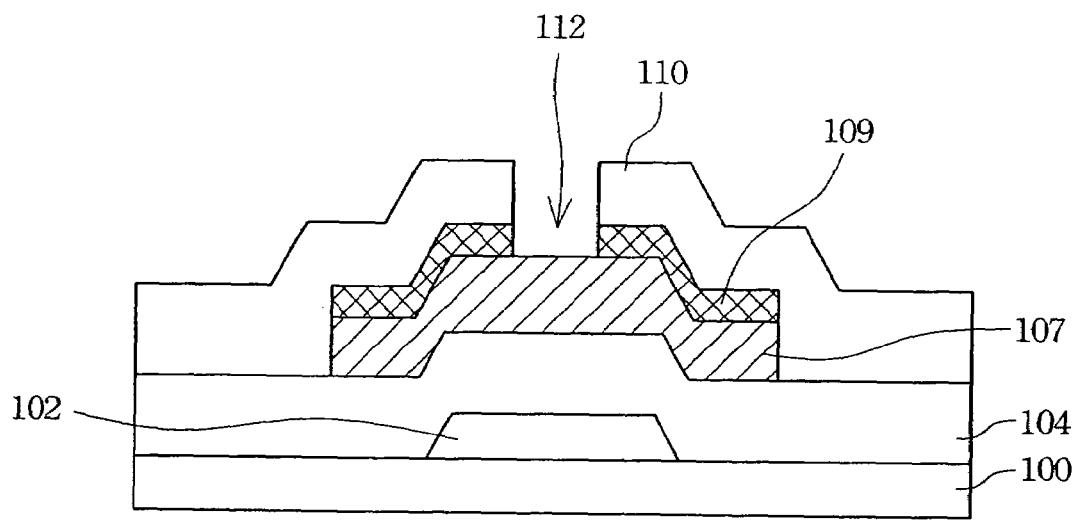

The a-Si TFT is finished through the aforementioned processes; then, referring to FIG. 1C, the heating process with an IR 114 is utilized, and the a-Si TFT is directly changed into the poly-Si TFT.

The heating process with the IR 114 can utilize any IR supply method; the preferable method in the present invention is a pulsed rapid thermal processing (PRTP) technology. Because of the film materials with different IR absorption, the TFT is heated selectively by the IR 114. The gate metal 102 and the S/D metal 110 have higher IR absorption and so absorb heat energy from the IR 114 rapidly. Therefore, the gate metal 102 and the S/D metal 110 are heated selectively to serve as the hot plates for transferring the heat energy to the doped a-Si layer 108 and the a-Si layer 106, and then the doped a-Si layer 108 and the a-Si layer 106 are induced to crystallize to become a doped poly-Si layer 109 and a poly-Si layer 107. The poly-Si TFT is thus formed.

The highest corresponding output temperature of the heating process is preferably about 900° C. The proportion occupied by metal films in the TFT is sufficient to transfer the heat energy absorbed by the doped a-Si layer 108 and the a-Si layer 106 for forming a poly-Si. The heating process employed is a pulsed heating process, not a continuous heating, and heats the film materials in the TFT selectively. Further, a glass substrate is unable to absorb the IR 114 effectively, so the device property is not affected and there are no glass substrate deformation problems associated with the process temperature.

Embodiment 2

Figure 2A:
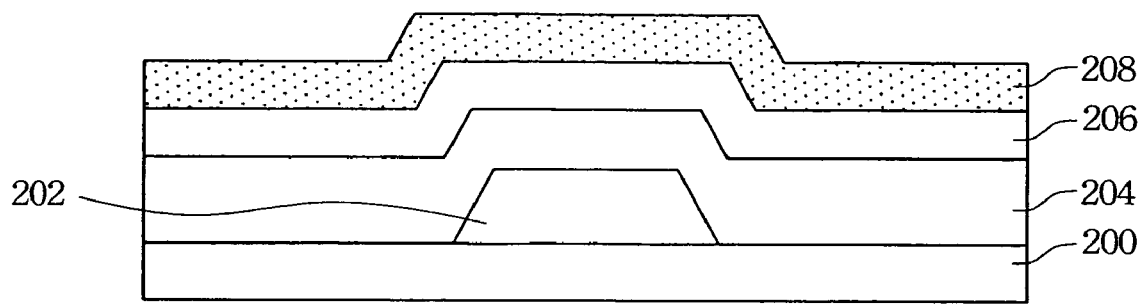
FIGS. 2A-2D are cross-sectional schematic diagrams showing the process for forming a poly-Si TFT in accordance with the second preferred embodiment of the present invention.

The present invention discloses another method of forming the poly-Si TFT combined with the bottom-gate CHP structural type. Referring to FIG. 2A, a gate metal 202 is first formed on a substrate 200 by, for example, PVD, and is then patterned by, for example, photolithography and etching. The substrate 200 may be a glass substrate, and the gate metal 202 is a material with good electric conductivity such as Cr, Mo or MoW; the gate metal 202 is also a material with good IR absorption and thermal stability.

A gate insulator 204, an a-Si layer 206, and a protective layer 208 are formed in turn on the gate metal 202 and the substrate 200 simultaneously by, for example, PECVD, and the preferred material of the gate insulator 204 and the protective layer 208 is $SiN_x$ or $SiO_x$.

Figure 2B:
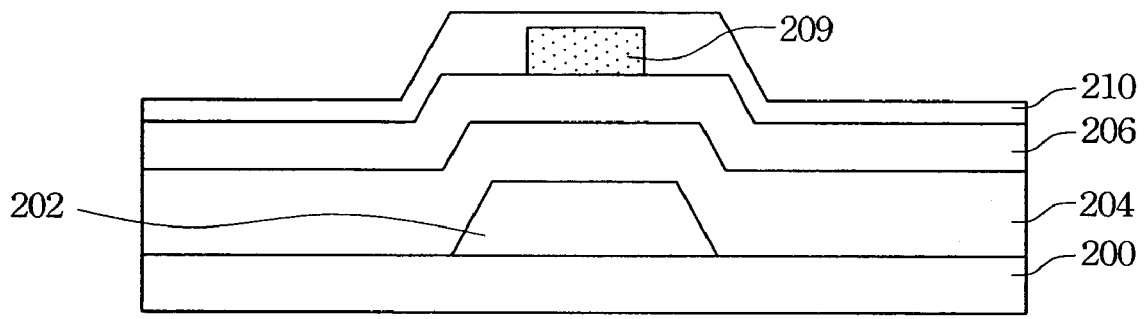

Referring to FIG. 2B, the protective layer 208 is patterned by, for example, photolithography and etching to form an etching stop layer 209 for protecting the channel region. Then, a doped a-Si layer 210 is formed on the a-Si layer 206 by, for example, PECVD. The a-Si layer 206 and the doped a-Si layer 210 are patterned partially by, for example, photolithography and etching to form an active layer region (not shown).

Figure 2C:
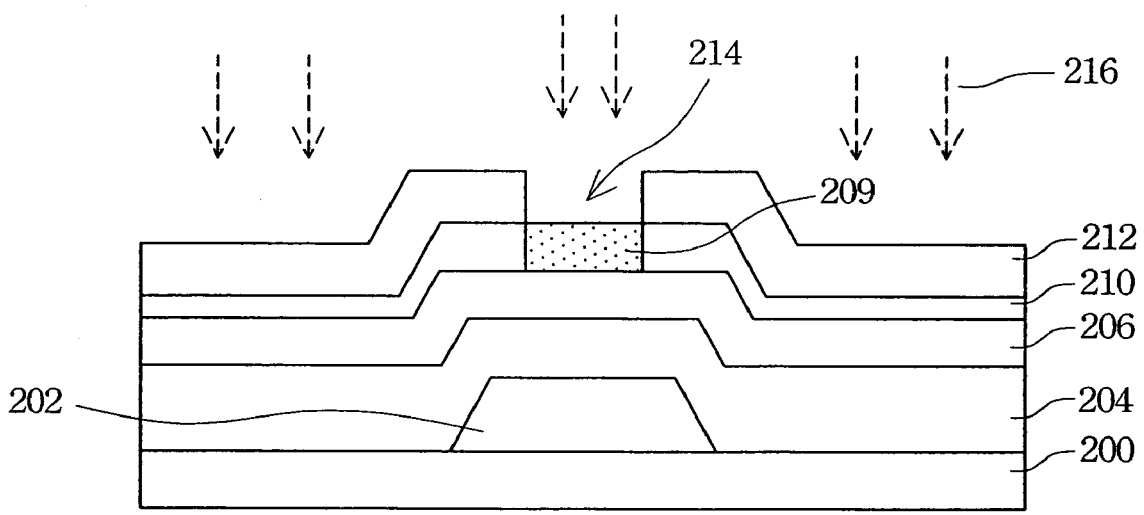

Next, referring to FIG. 2C, a S/D metal 212 is formed by, for example, PVD, and is patterned by, for example, photolithography and etching to form a data-line. The S/D metal 212 is a material with good electric conductivity such as Cr, Mo or MoW, and the S/D metal 110 is also a material with good IR absorption and thermal stability. Then, with the S/D metal 212 serving as a hard mask, the doped a-Si layer 210 between the S/D metal 212 is etched to form an opening 214 exposing the etching stop layer 209. The a-Si layer 206 under the etching stop layer 209 represents the channel region. Because the etching stop layer 209 protects the a-Si layer 206, the etching for the doped a-Si layer 210 stops at the etching stop layer 209 and avoids damaging the a-Si layer 206 under the etching stop layer 209.

Figure 2D:
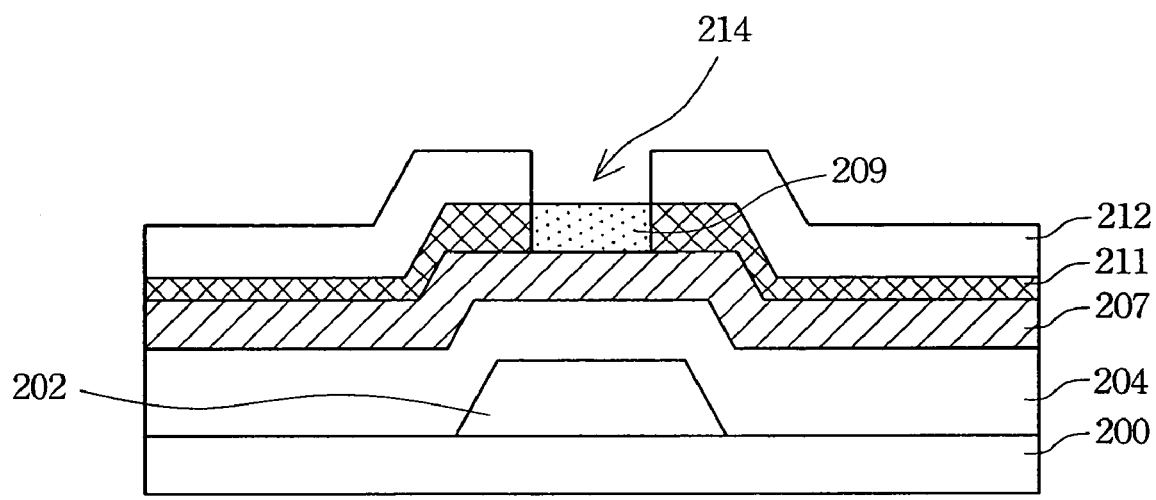

The a-Si TFT is finished through the aforementioned processes. With reference to FIG. 2D, the heating process with an IR 216 is utilized, and the a-Si TFT is directly changed into a poly-Si TFT.

The heating process with the IR 216 in the present invention is also preferably PRTP technology, and the TFT is heated selectively by the rapid heating process. The highest corresponding output temperature of the heating process is preferably about 900° C. With the gate metal 202 and the S/D metal 212 serving as hot plates to absorb heat energy from the IR 216 rapidly and then transfer the heat energy to the doped a-Si layer 210 and the a-Si layer 206, and the doped a-Si layer 210 and the a-Si layer 206 are induced to crystallize and become a doped poly-Si layer 211 and a poly-Si layer 207. The poly-Si TFT is thus formed.

Embodiment 3

Figure 3A:
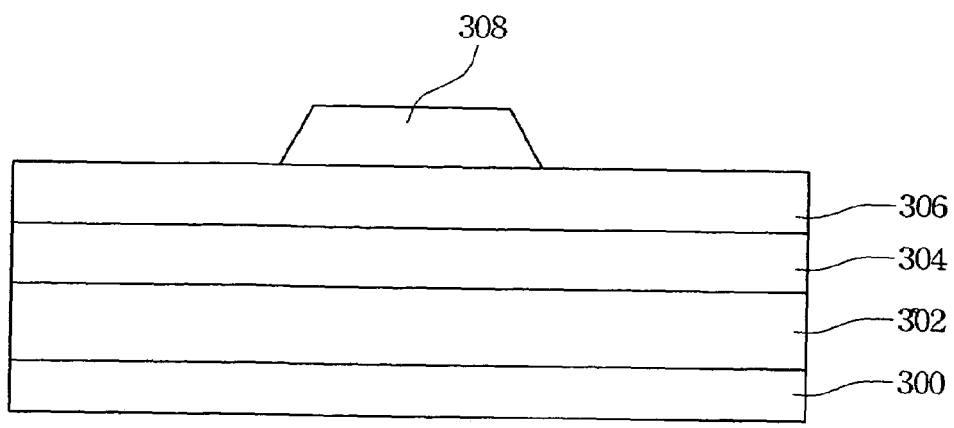
FIGS. 3A-3C are cross-sectional schematic diagrams showing the process for forming a poly-Si TFT in accordance with the third preferred embodiment of the present invention.

The present invention discloses further another method of forming the poly-Si TFT combined with the top-gate structural type. Referring to FIG. 3A, a buffer layer 302 is first formed on a substrate 300 by, for example, PECVD. The substrate 300 may be a glass substrate, and the buffer layer 302 may be a $SiO_x$ layer. Then, an a-Si layer 304 is formed on the buffer layer 302 by, for example, PECVD.

Next, a gate insulator 306 is formed on the a-Si layer 304 by, for example, PECVD; the preferred material of the gate insulator 306 is $SiO_x$. A gate metal 308 is formed by, for example, PVD, and is then patterned by, for example, photolithography and etching. The gate metal 308 is a material with good electric conductivity such as Cr, Mo or MoW, and the gate metal 308 is also a material with good IR absorption and thermal stability.

Figure 3B:
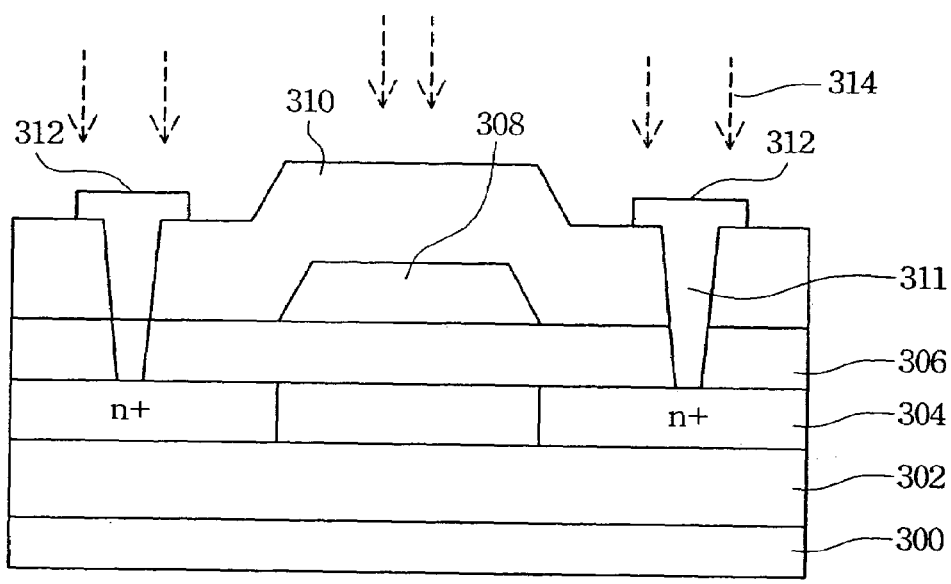

Then, referring to FIG. 3B, an ion-implantation is performed, with the gate metal 308 serving as a mask, and the a-Si layer 304 on two sides of the gate-metal 308 is implanted with ions to define a S/D region. A dielectric interlayer 310 is deposited by, for example, PECVD, and is then patterned by, for example, photolithography and etching to form contact holes 311 which exposes the S/D region. The preferred material of the dielectric interlayer 310 is $SiN_x$ or $SiO_x$.

Finally, a S/D metal 312 is formed by, for example, PVD, and is then patterned by, for example, photolithography and etching to form a data line. The S/D metal 312 is on the dielectric interlayer 310 and in the contact holes 311 to contact the a-Si layer 304 in the S/D region. The S/D metal 312 is a material with good electric conductivity such as Cr, Mo or MoW, and the S/D metal 312 is also a material with good IR absorption and thermal stability.

Figure 3C:
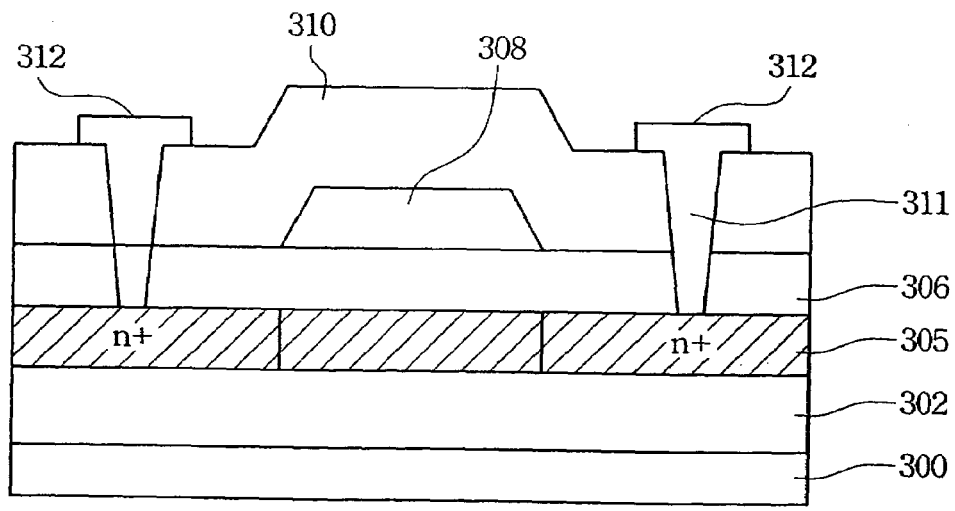

The a-Si TFT is finished through the aforementioned processes. With reference to FIG. 3C, the heating process with an IR 314 is utilized, and the a-Si TFT is directly changed into the poly-Si TFT.

The heating process with the IR 314 in the present invention is also preferably a PRTP technology, and the TFT is heated selectively by the rapid heating process. The highest corresponding output temperature of the heating proves is preferably about 900° C. With the gate metal 308 and the S/D metal 312 serving as hot plates to absorb heat energy from the IR 314 rapidly and then transfer the heat energy to the a-Si layer 304, and the a-Si layer 304 is induced to crystallize and become a poly-Si layer 205. The poly-Si TFT is thus formed.

With the foregoing embodiments, the only addition to the general a-Si TFT fabrication processes is the IR heating. The metal film materials in the TFT then absorb heat energy from the IR and transfer the heat energy to the a-Si layer, and the a-Si layer is induced to crystallize and become a poly-Si layer. Therefore, the a-Si TFT can be changed directly into a poly-Si TFT by employing the IR heating. The poly-Si TFT formed by the present invention can keep the advantages of the a-Si TFT fabrication and have a better electrical performance at the same time.

In addition to the LCD, the present invention also can be employed to fabricate a poly-Si TFT for driving the OLED, and then the product performance is improved greatly.

The present invention is not limited employed in TFT fabrication for flat panel display; other poly-Si TFT devices also can be fabricated by using the present invention to improve product efficiency. While the present invention has been disclosed with reference to the preferred embodiments of the present invention, it should not be considered as limited thereby. Various possible modifications and alterations by one skilled in the art can be included within the spirit and scope of the present invention, the scope of the invention is determined by the claims that follow.

What is claimed is:

1. A method of forming poly-silicon thin film transistors employed for flat panel display, comprising the steps of: forming a buffer layer on a substrate; forming an amorphous silicon layer on the buffer layer; forming a gate insulator on the amorphous silicon layer; forming a gate metal on the gate insulator; utilizing the gate metal as a mask to ion implant the amorphous silicon layer on two sides of the gate metal for defining a source/drain region in the amorphous silicon layer; forming a dielectric interlayer on the gate metal and the gate insulator; patterning the dielectric interlayer to form contact holes; forming a source/drain metal on the dielectric interlayer and in the contact holes to connect the source/drain region in the amorphous silicon layer; patterning the source/drain metal to form a data line; and performing a heating process with an IR energy source, wherein the gate metal and the source/drain metal rapidly absorb heat energy from the IR energy source and transfer the heat energy to the amorphous silicon layer, and the amorphous silicon layer subsequently crystallizes to become a poly-silicon layer.

2. The method of claim 1, wherein the gate metal is a metal material with good IR absorption and thermal stability.

3. The method of claim 2, wherein the metal material comprises chromium (Cr) or moly-tungsten (MoW).

4. The method of claim 1, wherein the dielectric interlayer comprises a silicon nitride layer or a silicon oxide layer.

5. The method of claim 1, wherein the source/drain metal is a metal material with good IR absorption and thermal stability.

6. The method of claim 5, wherein the metal material comprises chromium (Cr) or moly-tungsten (MoW).

7. The method of claim 1, wherein the heating process with the IR energy source comprises a pulsed rapid thermal processing (PRTP) technology.

* * * * *